United States Patent [19]

Biesecker et al.

[11] Patent Number: 4,917,561

[45] Date of Patent: Apr. 17, 1990

[54] FEEDER CASSETTE FOR A COMPONENT PROCESSING UNIT

[75] Inventors: Douglas A. Biesecker, Clarks Summit, Pa.; Daniel J. Horton, Conklin, N.Y.

[73] Assignee: Universal Instruments Corporation, Binghamton, N.Y.

[21] Appl. No.: 249,181

[22] Filed: Sep. 26, 1988

[51] Int. Cl.[4] .............................................. B65G 59/06
[52] U.S. Cl. ..................................... 414/414; 221/106
[58] Field of Search .................. 221/11, 104, 106, 92, 221/129, 197, 198; 414/414

[56] References Cited

U.S. PATENT DOCUMENTS

| | | | |
|---|---|---|---|
| 3,760,484 | 9/1973 | Kowalski | 221/129 X |
| 4,333,586 | 6/1982 | Stuckler | 221/106 |
| 4,500,246 | 2/1985 | Janisiewicz et al. | 221/11 X |

Primary Examiner—F. J. Bartuska
Attorney, Agent, or Firm—Fidelman & Wolffe

[57] ABSTRACT

The present invention is directed to a feeder cassette for feeding electronic components into a component processing unit. The cassette includes an assembly body having a plurality of slots formed on opposing interior sides thereof to form channels within the assembly body. The channels are designed to receive a plurality of components therein, preferably in pre-packed flat tubes. A leaf spring having a button projecting from the distal end of each of the fingers of the leaf spring permits only the components from a desired "activated" channel to be released. The cassette is indexed forwardly until all of the components have been released from each of the channels sequentially. The buttons of the spring fingers also serve to hold the components within the cassette if the cassette is withdrawn from the feeder unit at any time prior to fully emptying the tubes.

3 Claims, 4 Drawing Sheets

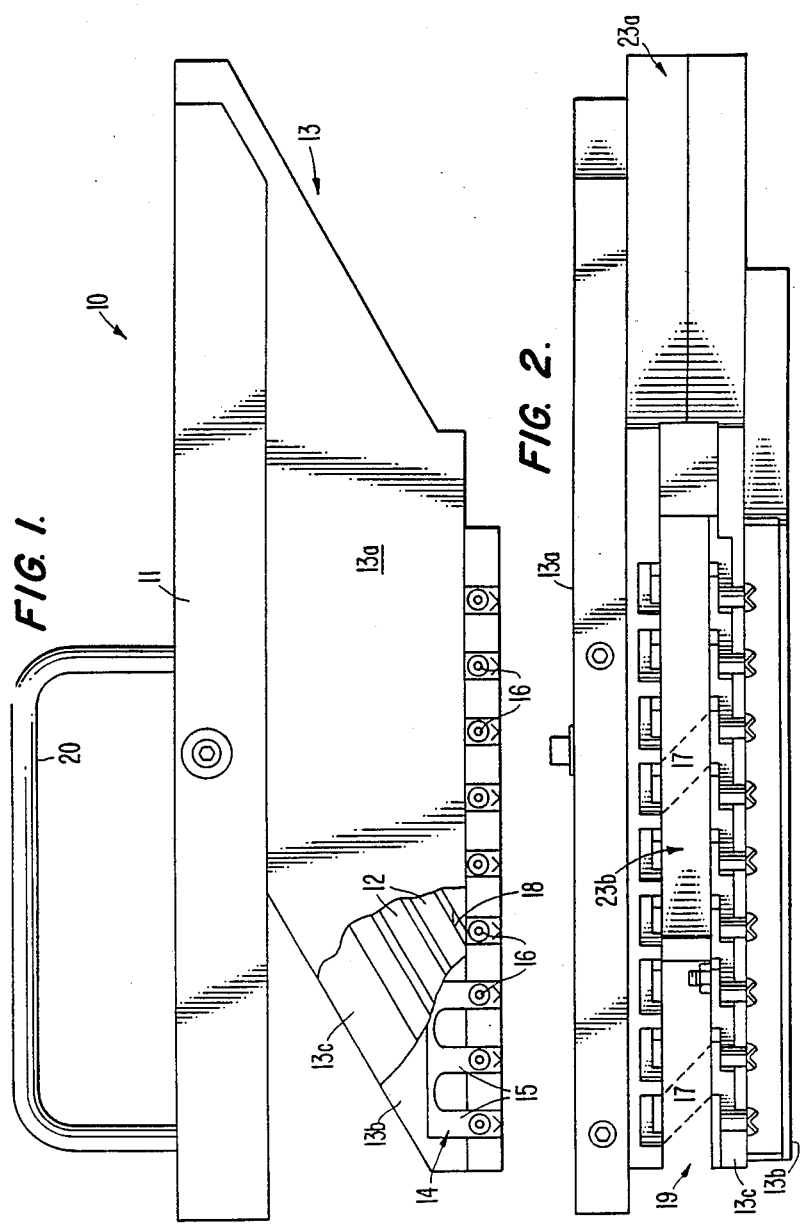

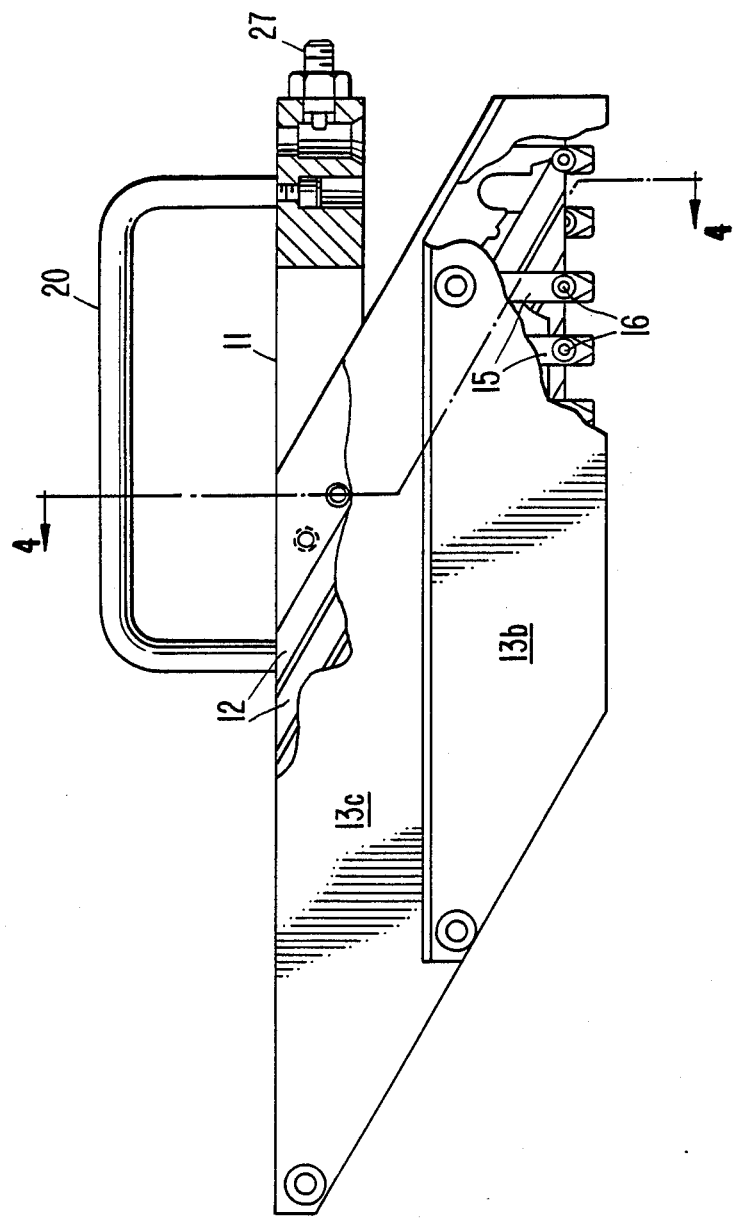

FEEDER CASSETTE FOR A COMPONENT PROCESSING UNIT

The present invention is directed to a feeder cassette and, more particularly, to a feeder cassette having a mechanism for preventing loss of components from the cassette when the feeder is stopped and/or the cassette is removed from the feeder prior to discharging all of the components.

BACKGROUND OF THE INVENTION

Tubes for holding multiple components, of any type, are well known in the art. These tubes hold the components stacked therein and are shaped to accommodate the particular type of component. A difficulty arises, however, when using conventional feeder mechanisms to feed components from these tubes. Often, the entire tube may be emptied inadvertently, especially when the feeder mechanism is stopped to remove a jammed component. Also when multiple tubes are aligned in a cassette, removal of the cassette may result in loss of all of the components.

SUMMARY OF THE INVENTION

The present invention overcomes the above disadvantages by providing a snap-in feeder cassette. The cassette includes an assembly body having a plurality of slots forming channels therein. Feed tubes, each filled with electronic components, such as those referred to as Flat Pak or DIPs in the trade, may be loaded into the channels in the tube holder assembly, preferably at a bench site. The components may also be manually loaded for very short production runs.

The cassette includes a leaf spring having projecting buttons or caps at the end of fingers that hold the components within the individual tubes until a tube is activated, at which time the corresponding finger including its projecting button is laterally displaced to release all of the components from the activated tube. The assembly body is indexed forwardly until all of the tubes are emptied. When the cassette is empty, it is easily removed from the tube assembly housing of the component feeder and replaced with a new, preferably pre-loaded, cassette. In this way, the present invention facilitates ease in loading tubes without the necessity of manually transferring components, thus significantly reducing the possibility of component misalignment. Moreover, the cassette may be withdrawn from the unit at any time, without risk of losing all of the components contained within the cassette.

BRIEF DESCRIPTION OF THE DRAWINGS

FIG. 1 is a front side elevational view, partially cut-away, of the feeder cassette in accordance with a preferred embodiment of the present invention;

FIG. 2 is a bottom end view of the feeder cassette illustrated in FIG. 1;

FIG. 3 is a back side elevational view of the feeder cassette illustrated in FIG. 1;

DETAILED DESCRIPTION OF THE PREFERRED EMBODIMENTS

Figure 5:
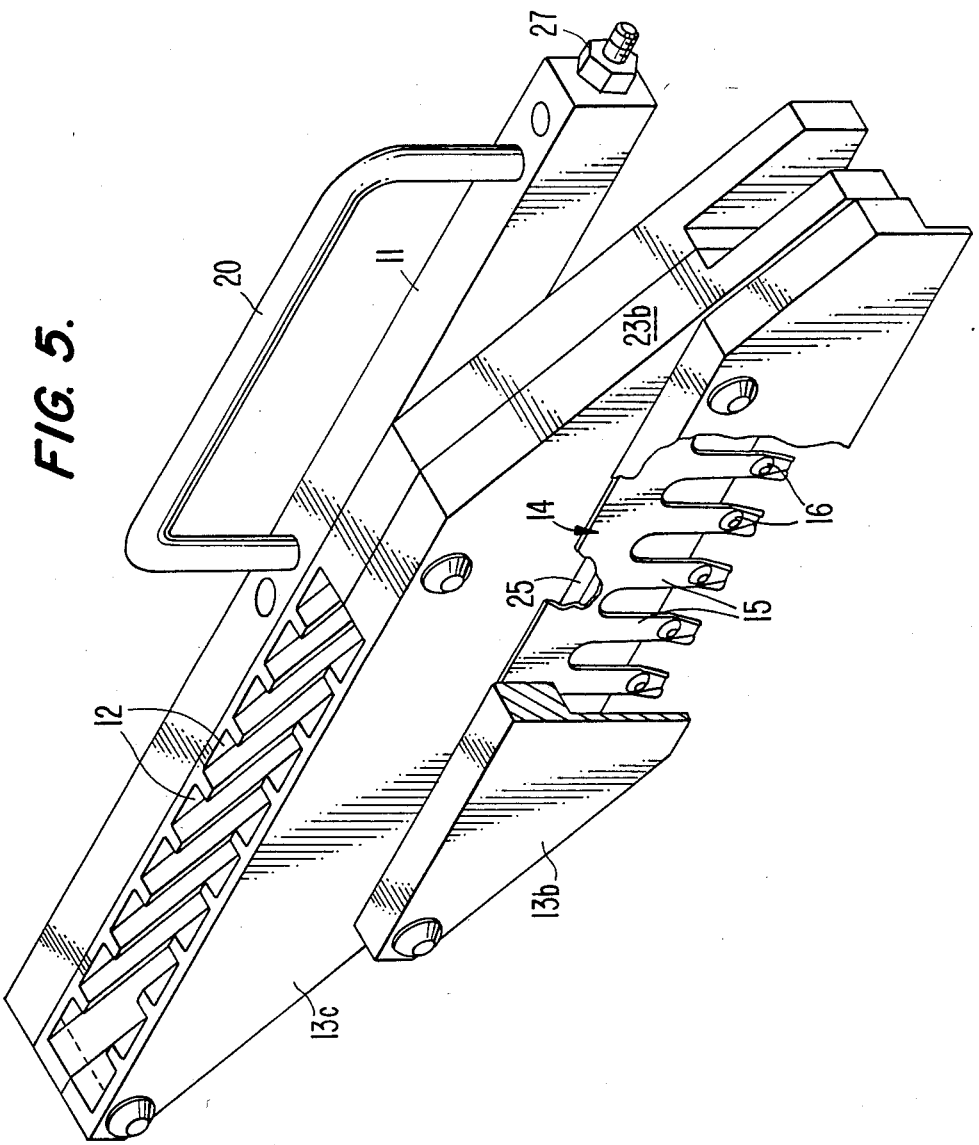
FIG. 5 is a perspective view of the feeder cassette illustrated in FIG. 3, partially cut-away.

A feeder cassette assembly for use in a tube assembly housing of a component feeder unit, in accordance with a preferred embodiment of the present invention, is shown in FIGS. 1, 3 and 5 and generally designated 10. Throughout the figures, like numerals are used to represent like elements.

Feeder cassette 10 includes frame 11 attached to holder assembly body 13 having two outer side walls 13a and 13b. Intermediate side wall 13c is disposed between outer side walls 13a and 13b. Assembly body 13 also includes end walls 23a and 23b, as can be seen more clearly in FIG. 2.

Figure 4:
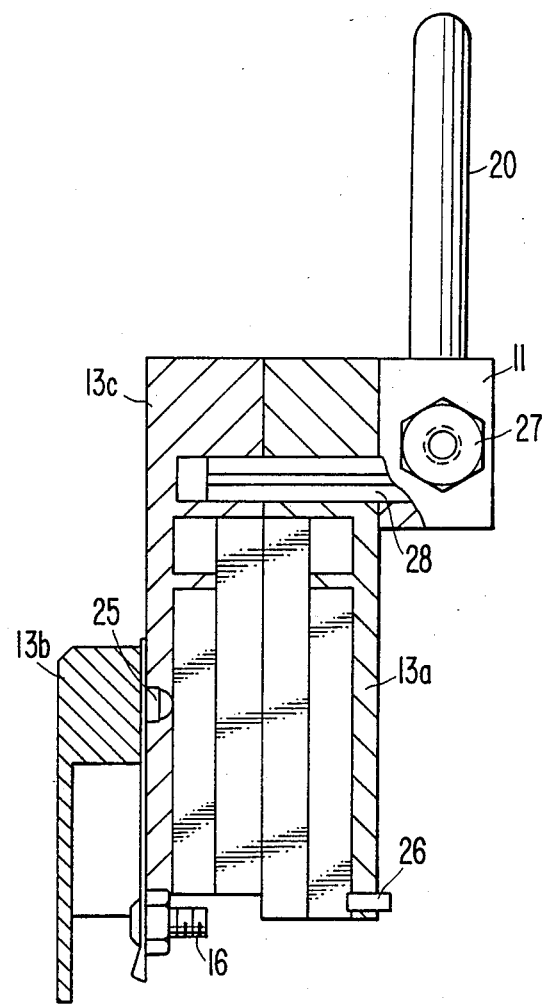
FIG. 4 is an end elevation view along line 4—4 of the feeder cassette illustrated in FIG. 3.

A handle 20 can be provided on the frame for convenience. Lock mechanism 27 is disposed at one end of frame 11. The lock mechanism can be of any suitable type, such as a ball detent, for securing the cassette in position in the component processing unit. Further, roll pin 28, seen clearly in FIG. 4, extends through the frame and the side walls and is used to maintain these pieces in proper alignment. In this way, the consistency between one cassette and the next is ensured.

A plurality of slots 12 are formed along the inner surfaces of both outer side wall 13a and intermediate side wall 13c. These slots are disposed opposite one another so as to create channels 17 (as seen within the dashed lines of FIG. 2) within the assembly body. While it is understood that the channels may have any suitable orientation with respect to the component feeder unit, in a preferred embodiment of the present invention they are slanted.

Channels 17 are designed to receive tubes, well known as in the industry, containing electronic components therein. Of course, the device of the present invention does not preclude the manual loading of components without such tubes. In a preferred embodiment, nine rectangular flat tubes are loaded into the feeder cassette at the bench site. Each pre-loaded cassette can be easily inserted into the feeder unit until all of the components are removed, at which time the empty cassette is simply replaced with a fresh cassette.

The pitch of the slots, and thus of the channels, is primarily determined by the pitch of an indexing mechanism discussed below. In a preferred embodiment of the present invention as shown in FIG. 1, the pitch is approximately 0.550 inches.

Leaf spring 14 is disposed between the outer surface of intermediate side wall 13c and the inner surface of side wall 3b, at the lower edge thereof, and is affixed thereto in any suitable manner. The leaf spring is formed of a suitably resilient material, such as copper. The leaf spring includes a plurality of downwardly extending spring fingers 15, the number of spring fingers 15 corresponding to the number of channels 17. Button 16 projects outwardly from the end of each spring finger. The buttons are preferably formed of a plastic material, such as nylon or the like.

Elastomeric strip 25 is preferably disposed between the leaf spring and the intermediate side wall and extends longitudinally along the length of the device. This strip cushions the device and prevents the tubes from vibrating within the channels. In addition, tube stop 26 is preferably formed projecting inwardly into the lower portion of the channels. In this way, the tube stop limits the downward extent of the tubes within the channels.

Each channel 17 opens onto an opening 19 formed in the lower portion of the assembly body, as can be clearly seen in FIG. 2. The button of each spring finger thus serves to hold the components within each individual tube until the components from a particular "activated" tube are fed, as will be discussed in more detail below.

Importantly, the buttons of the spring fingers also serve to hold the components within the cassette if the cassette is withdrawn from the feeder unit at any time prior to fully emptying the tubes. This would most often occur when attempting to remove a jammed component. Of course, upon removal of the cassette, one or two components that have already begun to feed from the activated tube may fall out. However, since a cassette according to the present invention ma hold as many as approximately 300 components, the loss of one or two components occurring with the present invention is relatively minor, as compared to the loss of all of the components in typical prior art devices.

A longitudinal slot 18 is formed along the inner surface of intermediate side wall 13c of the assembly body and extends substantially parallel to the bottom edge thereof. This longitudinal slot receives an indexing rod (not shown). In this way, the tube holder cassette is indexed forwardly in a known manner to present each desired slot individually to the inlet of the escapement mechanism (not shown) until all of the slots are emptied. A suitable indexing mechanism is described in U.S. Pat. No. 4,500,246, commonly-assigned herewith, the disclosure of which is incorporated herein by reference.

In operation, a cassette in accordance with the present invention is snap-fit or locked by lock mechanism 27 into the housing of a component feeder unit. The indexing mechanism moves the cassette forward one pitch so as to present the components of the first tube for escapement. As the cassette is advanced, a suitable mechanism of the component processing unit, such as a cam (not shown), opens and closes the spring fingers allowing the components in the activated tube to feed from the channels.

As the cassette is indexed forwardly, only the activated tube is opened by the cam, while all of the other tubes remain closed. As discussed above, if the cassette is removed from the housing for any reason it is lifted vertically whereby the button will be released from the cam and close over the open ends of the channel, preventing all but possibly one from falling out.

The above is for illustrative purposes only. Modification may be made, particularly with regard to size, shape and arrangement of parts, in accordance with the invention as defined by the appended claims.

We claim:

1. A snap-in feeder cassette device for feeding a plurality of components into a component processing unit, said device comprising:
    a component holder body having a plurality of channels formed therein, each channel accommodating a plurality of components;
    an outlet for discharging each of the components from the channels; and
    a means for activating each of said channels sequentially as said tube holder body is indexed forwardly, so as to discharge components from an activated channel prior to activating the next channel, and continuing until all of the components are discharged, said activating means maintaining the components within said channels anytime that said device is removed from the component processing unit prior to emptying all of said channels, wherein said activating means comprises a leaf spring, said leaf spring having one finger for each of said channels, and wherein each of said fingers has a button fixed at the distal end thereof.

2. A device as in claim 1, wherein said channels are slanted.

3. A device as in claim 2, further comprising a stop projecting inwardly at the lower portion of each of said channels.

* * * * *